(12) United States Patent
Sakui et al.

(10) Patent No.: US 9,093,152 B2
(45) Date of Patent: Jul. 28, 2015

(54) MULTIPLE DATA LINE MEMORY AND METHODS

(71) Applicant: Micron Technology, Inc., Boise, ID (US)

(72) Inventors: Koji Sakui, Setagayaku (JP); Peter Sean Feeley, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 13/661,498

(22) Filed: Oct. 26, 2012

(65) Prior Publication Data

US 2014/0119117 A1    May 1, 2014

(51) Int. Cl.
*G11C 11/34*    (2006.01)
*G11C 16/04*    (2006.01)

(52) U.S. Cl.
CPC .................................. *G11C 16/0483* (2013.01)

(58) Field of Classification Search
USPC ..................................................... 365/185.11
See application file for complete search history.

(56) References Cited

U.S. PATENT DOCUMENTS

| 7,243,185 | B2 | 7/2007 | See et al. |
| 2007/0158736 | A1* | 7/2007 | Arai et al. ..................... 257/315 |
| 2009/0238005 | A1 | 9/2009 | You |
| 2010/0322000 | A1 | 12/2010 | Shim et al. |
| 2011/0266604 | A1* | 11/2011 | Kim et al. ..................... 257/314 |
| 2011/0299314 | A1 | 12/2011 | Samachisa et al. |
| 2012/0044733 | A1 | 2/2012 | Scheuerlein |
| 2012/0063231 | A1 | 3/2012 | Wood et al. |
| 2012/0257433 | A1 | 10/2012 | Yan et al. |
| 2014/0369116 | A1* | 12/2014 | Sakui ....................... 365/185.02 |

FOREIGN PATENT DOCUMENTS

KR    102011013282 A    12/2011

OTHER PUBLICATIONS

"International Application Serial No. PCT/US2013/066941, International Search Report mailed Feb. 10, 2014", 3 pgs.
"International Application Serial No. PCT/US2013/066941, Written Opinion mailed Feb. 10, 2014", 7 pgs.

* cited by examiner

*Primary Examiner* — Kretelia Graham
(74) *Attorney, Agent, or Firm* — Schwegman Lundberg & Woessner, P.A.

(57) ABSTRACT

Apparatuses and methods are disclosed, including an apparatus with rows of vertical strings of memory cells coupled to a common source and multiple data lines associated with each row of vertical strings. Each data line associated with a row is coupled to at least one of the vertical strings in the row. Additional apparatuses and methods are described.

36 Claims, 13 Drawing Sheets

MULTIPLE DATA LINE MEMORY AND METHODS

BACKGROUND

Semiconductor memory components are used in many electronic devices such as personal digital assistants (PDAs), laptop computers, mobile phones and digital cameras. Some of these semiconductor memory components have arrays of charge storage devices.

BRIEF DESCRIPTION OF THE DRAWINGS

Some embodiments are illustrated by way of example and not limitation in the figures of the accompanying drawings in which.

DETAILED DESCRIPTION

A block of charge storage devices according to various embodiments of the invention may function as a block of memory cells in a memory device such as a NOT AND (NAND) memory device.

For the purposes of this document, an "apparatus" can refer to any of a number of structures, such as circuitry, a device or a system. In this document, a charge storage device or a transistor is described as being switched "on" to assume an activated state when it is rendered conductive by a control gate voltage that is separated from its source voltage by at least its threshold voltage. The charge storage device or the transistor is described as being switched "off" to assume an inactive state when the difference between the control gate voltage and the source voltage is less than the threshold voltage, so that the charge storage device or the transistor is rendered non-conductive. A "potential" is always an electrical potential. Multiple charge storage devices can be read at the same time during a page read operation where a "page" includes a fixed amount of data, such as two kilobytes (KB) of data within a memory chip. A "tier of semiconductor material" can mean semiconductor material formed in a same plane, rank, row, or unit, such as in a horizontal or vertical or sloped plane, row, rank or unit of a structure.

There is often a need to increase the speed with which data can be programmed to or read from a memory device. There may also be a need to reduce the power consumption of a programming operation or a read operation. The inventors have discovered that some of these operational challenges, as well as others, can be addressed by using multiple data lines to access each row of vertical strings of charge storage devices in a block of charge storage devices.

Figure 1:
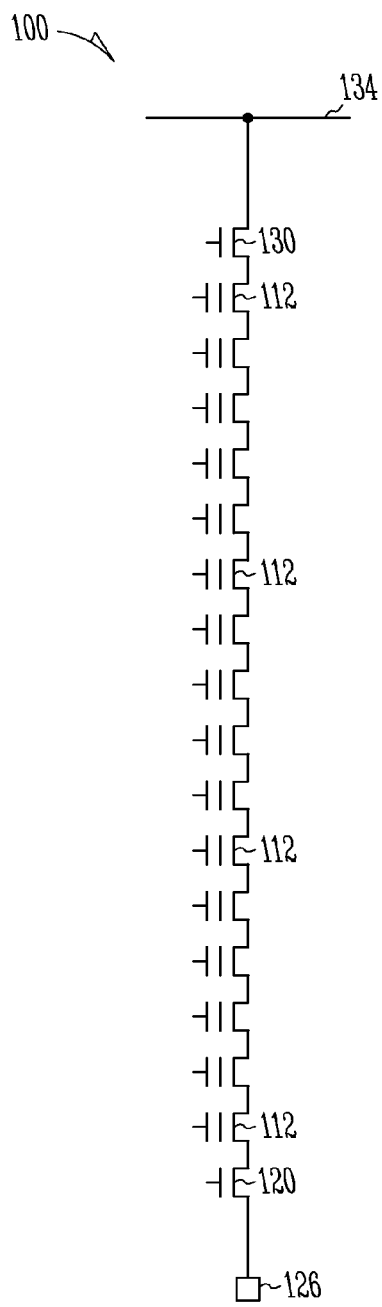
FIG. 1 is an electrical schematic diagram of an apparatus in the form of a vertical string of charge storage devices according to various embodiments of the invention.

FIG. 1 is an electrical schematic diagram of an apparatus in the form of a vertical string 100 of charge storage devices according to various embodiments of the invention. The vertical string 100 includes 16 charge storage devices 112 coupled in series, and can include more or less than 16 charge storage devices 112. The vertical string 100 includes a source select gate (SGS) transistor 120 which may be an n-channel transistor coupled between one of the charge storage devices 112 at one end of the vertical string 100 and a common source 126. The common source 126 may comprise, for example, a slot of commonly doped semiconductor material and/or other conductive material. At the other end of the vertical string 100, a drain select gate (SGD) transistor 130 may be an n-channel transistor coupled between one of the charge storage devices 112 and a data line 134. The common source 126 can be coupled to a reference voltage Vss (e.g., ground voltage) or a voltage source (e.g., a charge pump circuit not shown). Two elements coupled together are in electrical contact with each other or are separated by one or more conductors or semiconductors that enable conduction between the elements. Two elements in electrical contact with each other are in physical contact at a junction (e.g., a p-n junction) that enables a flow of electrons or holes across the junction.

Each charge storage device 112 may comprise, for example, a floating gate transistor or a charge trap transistor and may be a single level charge storage device or a multilevel charge storage device. The charge storage devices 112, the SGS transistor 120, and the SGD transistor 130 are controlled by signals on their respective control gates, the signals being provided on access lines (not shown). In some cases, the control gates can at least partially form the access lines. The SGS transistor 120 receives a signal that controls the SGS transistor 120 to substantially control conduction between the vertical string 100 and the common source 126. The SGD transistor 130 receives a signal that controls the SGD transistor 130, so that the SGD transistor 130 can be used to select or deselect the vertical string 100. The vertical string 100 can be one of multiple vertical strings of charge storage devices in a block in a memory device, such as a NAND memory device.

Figure 2:
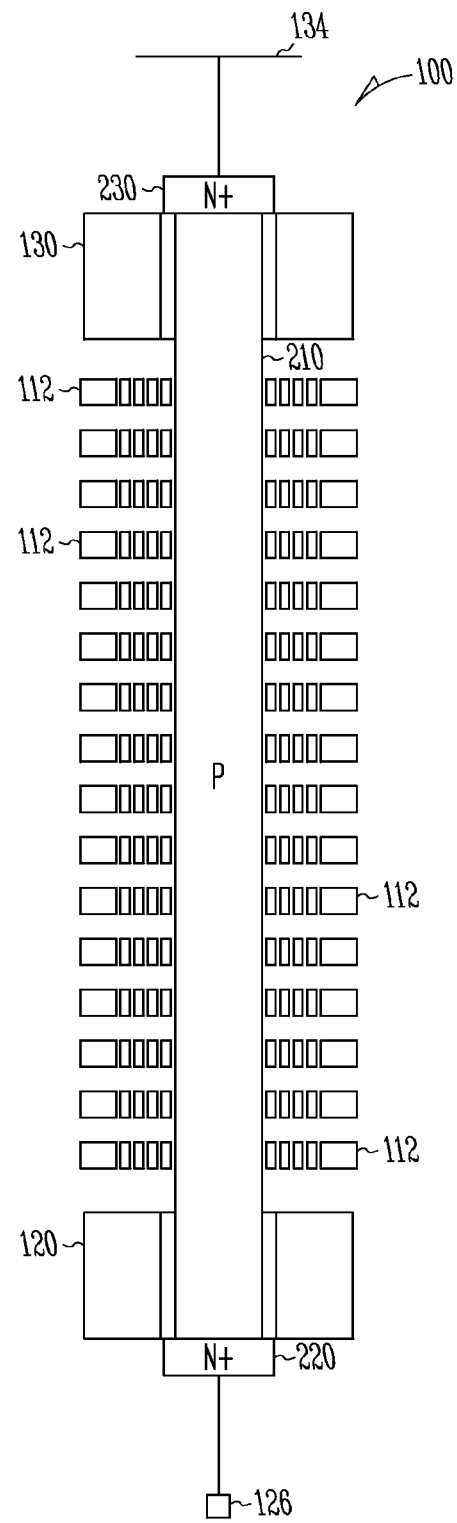
FIG. 2 is a cross-sectional view of a semiconductor construction of the vertical string shown in FIG. 1 according to various embodiments of the invention.

FIG. 2 is a cross-sectional view of a semiconductor construction of the vertical string 100 shown in FIG. 1 according to various embodiments of the invention. The charge storage devices 112, the SGS transistor 120 and the SGD transistor 130 at least partially surround (e.g., surround or partially surround) a pillar 210 of semiconductor material. The pillar 210 can comprise p type polysilicon and is a channel for the charge storage devices 112, the SGS transistor 120 and the SGD transistor 130. The charge storage devices 112, the SGS transistor 120 and the SGD transistor 130 are associated with the pillar 210. The pillar 210 extends between a source cap 220 comprising n+ type polysilicon and a drain cap 230 comprising n+ type polysilicon. The charge storage devices 112 of the vertical string 100 are located in different tiers of the semiconductor construction along a vertical extent of the pillar 210, thus forming the vertical string 100 as a "vertical" string of charge storage devices. The source cap 220 is in electrical contact with the pillar 210 and forms a p-n junction with the pillar 210. The drain cap 230 is in electrical contact with the pillar 210 and forms a p-n junction with the pillar 210. The source cap 220 is a source for the pillar 210 and the drain cap 230 is a drain for the pillar 210. The source cap 220 is coupled to the common source 126. The drain cap 230 is coupled to the data line 134.

Figure 3:
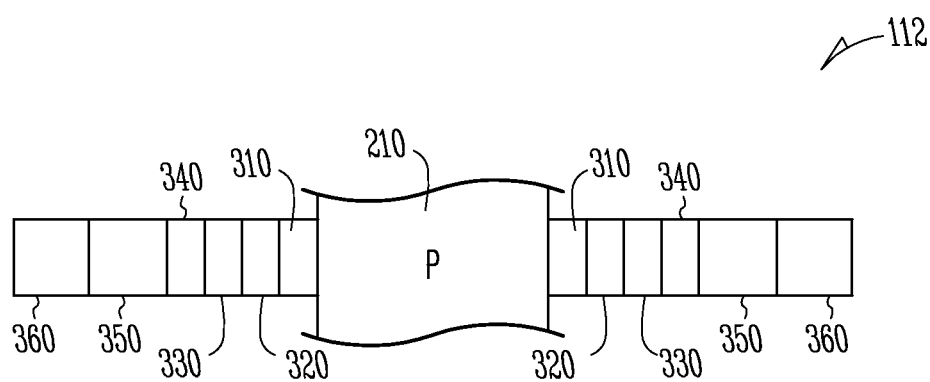
FIG. 3 is a cross-sectional view of a semiconductor construction of a charge storage device of the vertical string shown in FIG. 1 and FIG. 2 according to various embodiments of the invention.

FIG. 3 is a cross-sectional view of a semiconductor construction of a charge storage device 112 of the vertical string 100 shown in FIG. 1 and FIG. 2 according to various embodiments of the invention. The charge storage device 112 surrounds or partially surrounds the pillar 210. The pillar 210 can comprise p type polysilicon. The pillar 210 may be surrounded or partially surrounded by a first dielectric 310 comprising silicon dioxide ($SiO_2$). The first dielectric 310 may be surrounded or partially surrounded by a floating gate 320 comprising polysilicon. The floating gate 320 may be surrounded or partially surrounded by a second dielectric 330 comprising silicon dioxide ($SiO_2$) and silicon nitride ($Si_3N_4$) and a third dielectric 340 comprising silicon dioxide ($SiO_2$) such that the second dielectric 330 and the third dielectric 340 comprise an inter-poly dielectric (IPD) layer of oxide-nitride-oxide ($SiO_2Si_3N_4SiO_2$ or "ONO"). The third dielectric 340 may be surrounded or partially surrounded by a control gate 350 comprising polysilicon. The control gate 350 may be surrounded or partially surrounded by a metal silicide 360. The metal silicide 360 may comprise, for example, one or more of cobalt silicide (CoSi), titanium silicide (TiSi), tungsten silicide (WSi), nickel silicide (NiSi), tantalum silicide (TaSi), molybdenum silicide (MoSi) or platinum silicide (PtSi).

Figure 4:
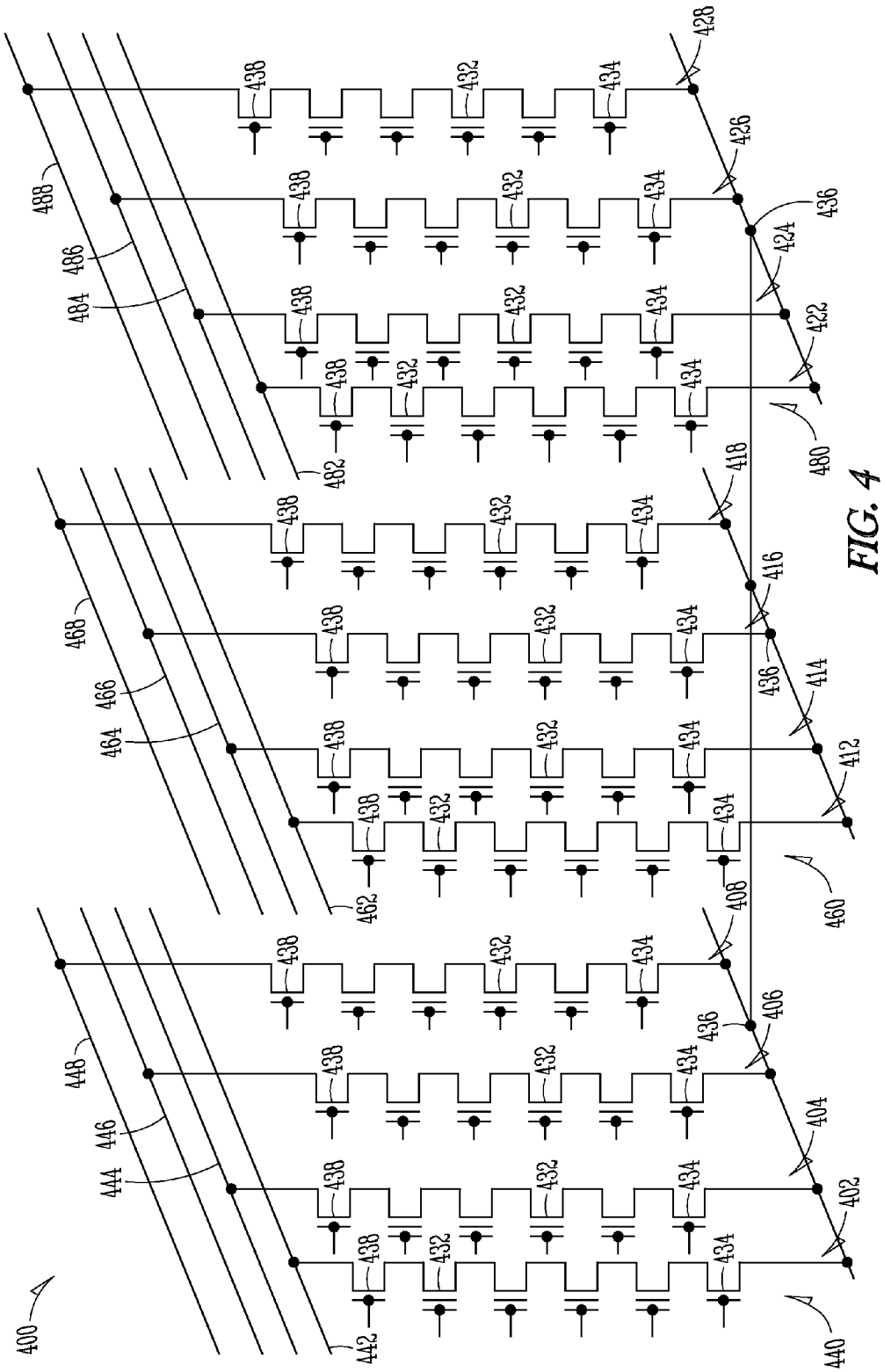
FIG. 4 is an electrical schematic diagram of an apparatus in the form of a block of charge storage devices according to various embodiments of the invention.

FIG. 4 is an electrical schematic diagram of an apparatus in the form of a block 400 of charge storage devices according to various embodiments of the invention. The block 400 includes twelve vertical strings 402, 404, 406, 408, 412, 414, 416, 418, 422, 424, 426 and 428 of charge storage devices 432. Each vertical string 402-428 includes four charge storage devices 432, and can include more or less than four charge storage devices 432. Each vertical string 402-428 includes an SGS transistor 434 coupled between one of the charge storage devices 432 at one end of the vertical string and a single common source 436 for the block 400. At the other end of the vertical string, an SGD transistor 438 is coupled between one of the charge storage devices 432 and a data line described below.

The vertical strings 402, 404, 406 and 408 of charge storage devices 432 comprise a first row 440 of vertical strings in the block 400 coupled to four separate data lines 442, 444, 446 and 448. The SGD transistor 438 of the vertical string 402 is coupled to the data line 442. The SGD transistor 438 of the vertical string 404 is coupled to the data line 444. The SGD transistor 438 of the vertical string 406 is coupled to the data line 446. The SGD transistor 438 of the vertical string 408 is coupled to the data line 448.

The vertical strings 412, 414, 416 and 418 of charge storage devices 432 comprise a second row 460 of vertical strings in the block 400 coupled to four separate data lines 462, 464, 466 and 468. The SGD transistor 438 of the vertical string 412 is coupled to the data line 462. The SGD transistor 438 of the vertical string 414 is coupled to the data line 464. The SGD transistor 438 of the vertical string 416 is coupled to the data line 466. The SGD transistor 438 of the vertical string 418 is coupled to the data line 468.

The vertical strings 422, 424, 426 and 428 of charge storage devices 432 comprise a third row 480 of vertical strings in the block 400 coupled to four separate data lines 482, 484, 486 and 488. The SGD transistor 438 of the vertical string 422 is coupled to the data line 482. The SGD transistor 438 of the vertical string 424 is coupled to the data line 484. The SGD transistor 438 of the vertical string 426 is coupled to the data line 486. The SGD transistor 438 of the vertical string 428 is coupled to the data line 488.

Gates of the SGD transistors 438 of the vertical strings 402, 412 and 422 can be coupled together to receive the same signal to associate the vertical strings 402, 412 and 422. Gates of the SGD transistors 438 of the vertical strings 404, 414 and 424 can be coupled together to receive the same signal to associate the vertical strings 404, 414 and 424. Gates of the SGD transistors 438 of the vertical strings 406, 416 and 426 can be coupled together to receive the same signal to associate the vertical strings 406, 416 and 426. Gates of the SGD transistors 438 of the vertical strings 408, 418 and 428 can be coupled together to receive the same signal to associate the vertical strings 408, 418 and 428.

Adjacent vertical strings 402-428 in the block 400 are coupled to different data lines 442, 444, 446, 448, 462, 464, 466, 468, 482, 484, 486 and 488. For example, the vertical strings 402 and 404 are adjacent and are coupled to different data lines 442 and 444. The vertical strings 408 and 418 are in different rows 440 and 460, are adjacent and are coupled to different data lines 448 and 468. The vertical strings 424 and 426 are adjacent and are coupled to different data lines 484 and 486.

The data lines 442, 462 and 482 are located in a first tier above the vertical strings 402-428. The data lines 444, 464 and 484 are located in a second tier above the data lines 442, 462 and 482. The data lines 446, 466 and 486 are located in a third tier above the data lines 444, 464 and 484. The data lines 448, 468 and 488 are located in a fourth tier above the data lines 446, 466 and 486. The data lines 442, 444, 446, 448, 462, 464, 466, 468, 482, 484, 486 and 488 can be under the vertical strings 402-428 according to various embodiments of the invention.

Figure 5:
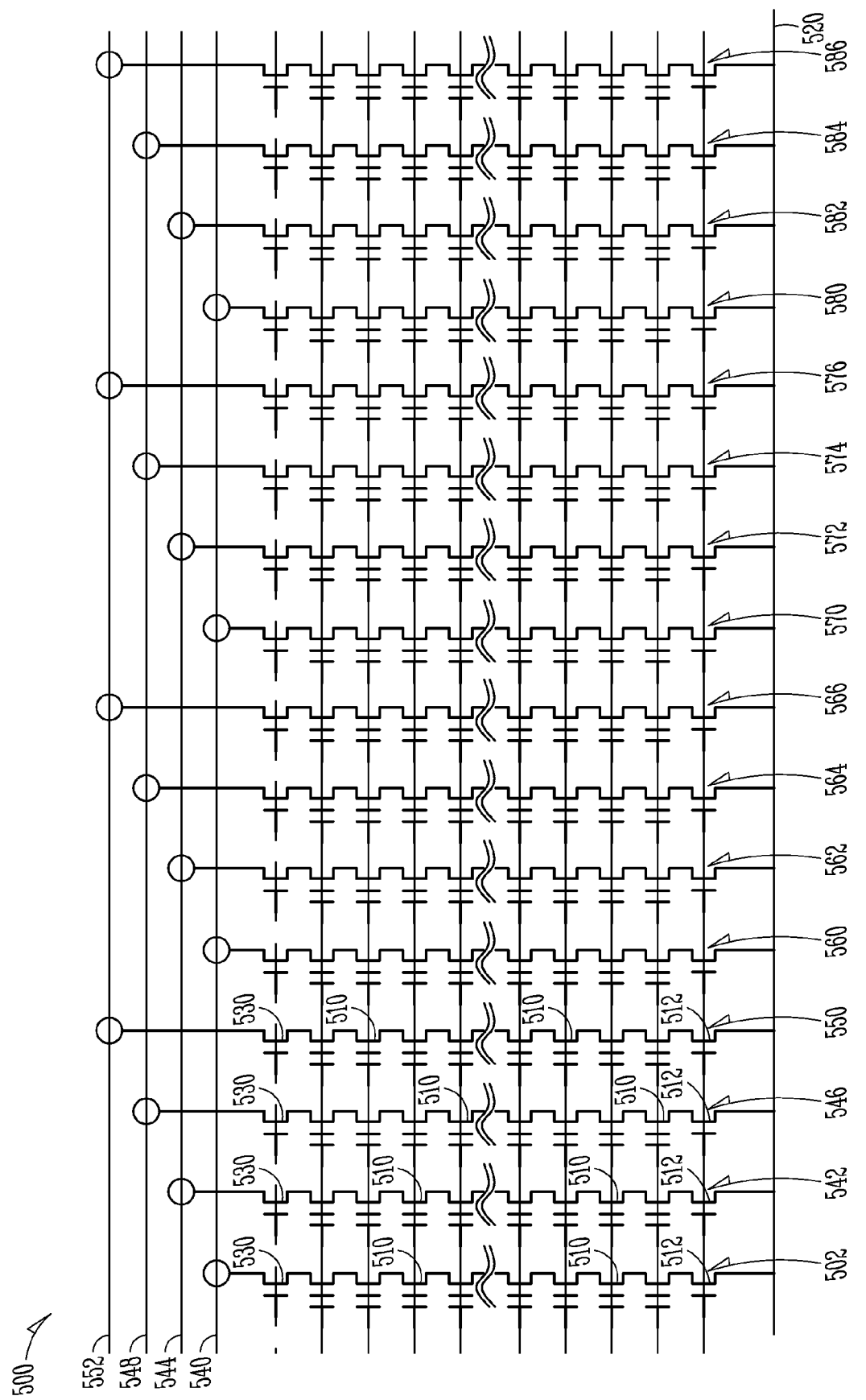
FIG. 5 is an electrical schematic diagram of an apparatus in the form of a row of vertical strings of charge storage devices according to various embodiments of the invention.

FIG. 5 is an electrical schematic diagram of an apparatus in the form of a row 500 of vertical strings of charge storage devices according to various embodiments of the invention. The row 500 includes multiple vertical strings of charge storage devices and is a portion of a block including multiple rows of vertical strings of charge storage devices (not shown). The row includes a vertical string 502 including 32 charge storage devices 510 coupled in series, and can include more or less than 32 charge storage devices 510. Charge storage devices 510 in the middle of the vertical string 502 are not shown but are represented by a dashed line for purposes of brevity and clarity. The vertical string 502 includes a SGS transistor 512, which may be an n-channel transistor, coupled between one of the charge storage devices 510 at one end of the vertical string 502 and a common source 520. The common source 520 may comprise, for example, a slot of commonly doped semiconductor material and/or other conductive material. At the other end of the vertical string 502, a SGD transistor 530, which may be an n-channel transistor, is coupled between one of the charge storage devices 510 and a first data line 540. The common source 520 can be coupled to a reference voltage Vss (e.g., ground voltage) or a voltage source (e.g., a charge pump circuit not shown). Thus, the vertical string 502 may have elements similar to or identical to the elements of the vertical string 100 shown in FIG. 1.

The row 500 includes a vertical string 542 of charge storage devices including the same elements as the vertical string 502. The SGD transistor 530 of the vertical string 542 is coupled to a second data line 544 that is separate from the first data line 540 and may be located above the first data line 540 in a semiconductor construction. The SGS transistor 512 of the vertical string 542 is coupled to the common source 520. The row 500 includes a vertical string 546 of charge storage devices including the same elements as the vertical string 502. The SGD transistor 530 of the vertical string 546 is coupled to a third data line 548 that is separate from the first data line 540 and the second data line 544. The third data line 548 may be located above the second data line 544 in a semiconductor construction. The SGS transistor 512 of the vertical string 546 is coupled to the common source 520. The row 500 includes a vertical string 550 of charge storage devices including the same elements as the vertical string 502. The SGD transistor 530 of the vertical string 550 is coupled to a fourth data line 552 that is separate from the other data lines 540, 544 and 548. The fourth data line 552 may be located above the third data line 548 in a semiconductor construction. The SGS transistor 512 of the vertical string 550 is coupled to the common source 520. The row 500 includes four vertical strings 502, 542, 546 and 550 that are each coupled, respectively, to a separate data line 540, 544, 548 and 552.

The row 500 includes additional vertical strings of charge storage devices coupled to each of the data lines 540, 544, 548 and 552. A vertical string 560 of charge storage devices is coupled to the data line 540, a vertical string 562 of charge storage devices is coupled to the data line 544, a vertical string 564 of charge storage devices is coupled to the data line 548 and a vertical string 566 of charge storage devices is coupled to the data line 552. Each of the vertical strings 560, 562, 564 and 566 includes the same elements as the vertical string 502.

A vertical string 570 of charge storage devices is coupled to the data line 540, a vertical string 572 of charge storage devices is coupled to the data line 544, a vertical string 574 of charge storage devices is coupled to the data line 548 and a vertical string 576 of charge storage devices is coupled to the data line 552. Each of the vertical strings 570, 572, 574 and 576 includes the same elements as the vertical string 502.

A vertical string 580 of charge storage devices is coupled to the data line 540, a vertical string 582 of charge storage devices is coupled to the data line 544, a vertical string 584 of charge storage devices is coupled to the data line 548 and a vertical string 586 of charge storage devices is coupled to the data line 552. Each of the vertical strings 580, 582, 584 and 586 includes the same elements as the vertical string 502.

All of the vertical strings 502 and 542-586 in the row 500 are coupled to the common source 520. The charge storage devices 510 in the same position in each of the vertical strings 502 and 542-586 have their control gates coupled to the same access line (not shown) to receive the same signal. The SGS transistors 512 of all of the vertical strings 502 and 542-586 have control gates coupled to the same select line (not shown) to receive the same signal. Control gates of the SGD transistors 530 of the vertical strings 502 and 542-586 receive separate signals.

Figure 6:
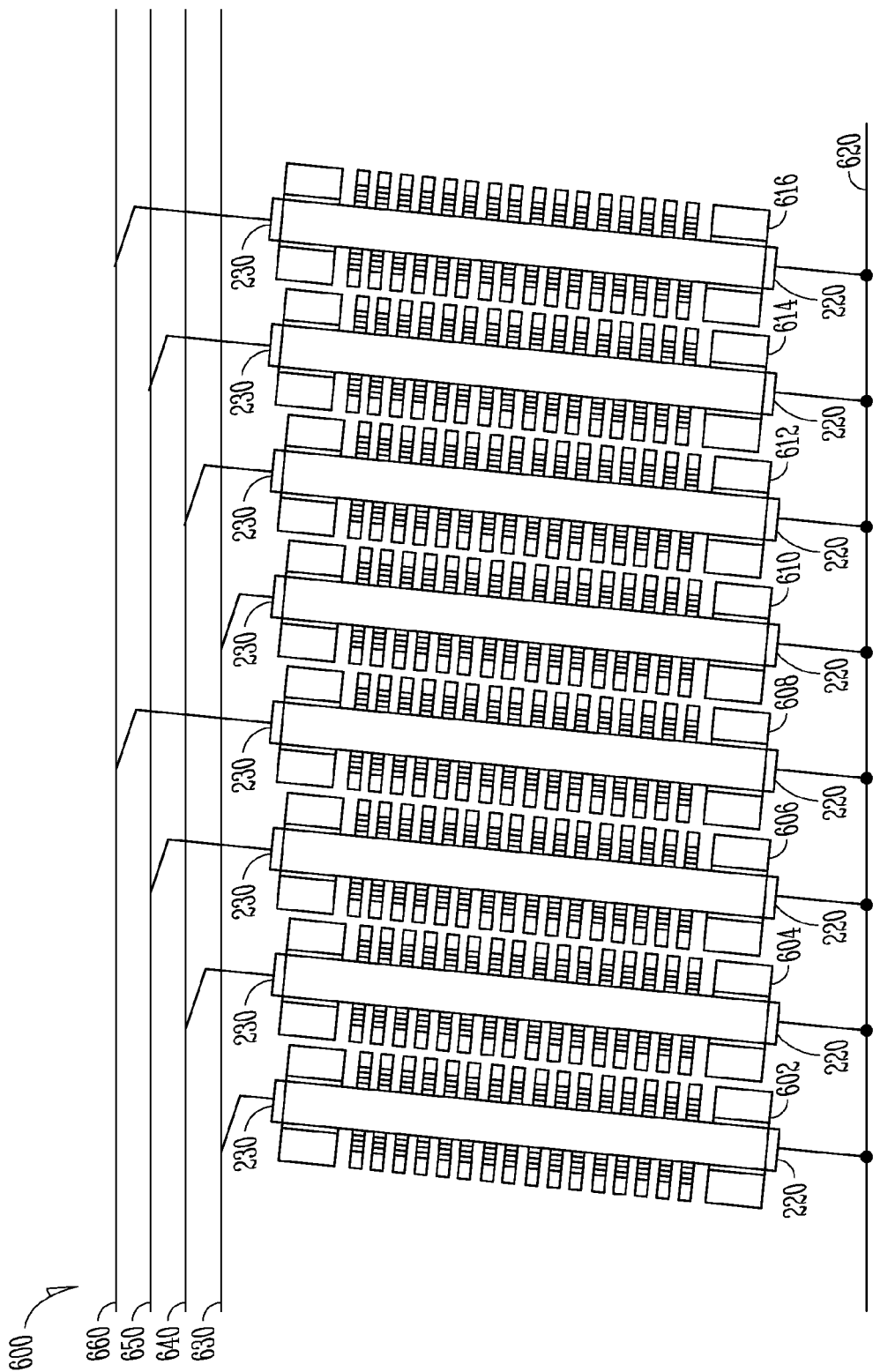
FIG. 6 is a view of an apparatus in the form of a semiconductor construction of a row of vertical strings of charge storage devices according to various embodiments of the invention.

FIG. 6 is a view of an apparatus in the form of a semiconductor construction of a row 600 of vertical strings of charge storage devices according to various embodiments of the invention. The row 600 includes eight vertical strings 602, 604, 606, 608, 610, 612, 614 and 616 of charge storage devices. The vertical strings 602, 604, 606, 608, 610, 612, 614 and 616 may each be similar to or identical to the vertical string 100 shown in FIG. 2 according to various embodiments of the invention. The source caps 220 of all of the vertical strings 602-616 are coupled to a common source 620. The drain cap 230 of the vertical string 602 is coupled to a data line 630, the drain cap 230 of the vertical string 604 is coupled to a data line 640, the drain cap 230 of the vertical string 606 is coupled to a data line 650, and the drain cap 230 of the vertical string 608 is coupled to a data line 660. The drain cap 230 of the vertical string 610 is coupled to the data line 630, the drain cap 230 of the vertical string 612 is coupled to the data line 640, the drain cap 230 of the vertical string 614 is coupled to the data line 650, and the drain cap 230 of the vertical string 616 is coupled to the data line 660. The data lines 630, 640, 650 and 660 may be formed in separate tiers of the semiconductor construction of the row 600.

Figure 7:
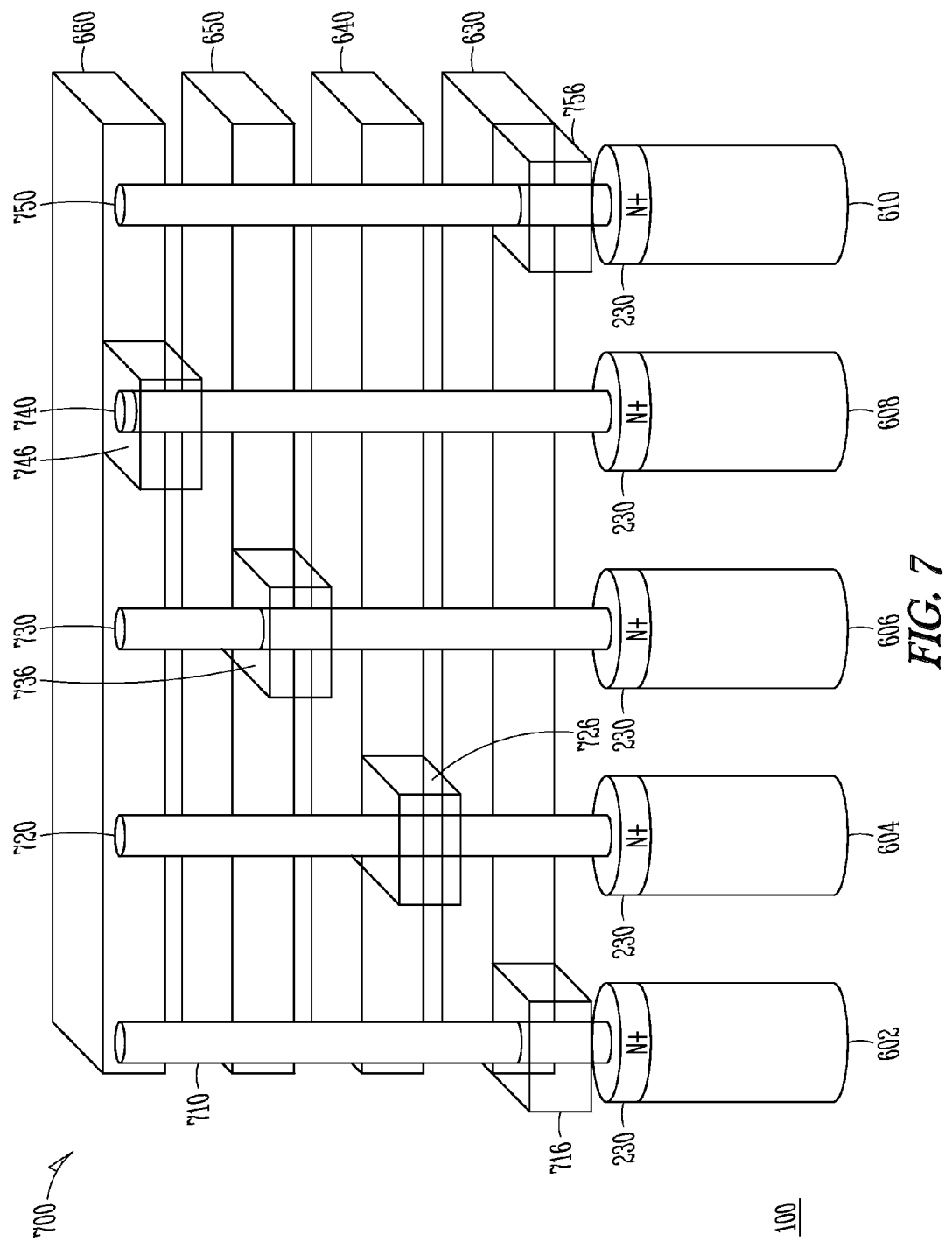
FIG. 7 is a view of an apparatus in the form of a portion of the semiconductor construction of the row of vertical strings of charge storage devices shown in FIG. 6 according to various embodiments of the invention.

FIG. 7 is a view of an apparatus in the form of a portion of the semiconductor construction of the row 600 of vertical strings of charge storage devices shown in FIG. 6 according to various embodiments of the invention. FIG. 7 includes the vertical strings 602, 604, 606, 608 and 610 shown as pillars. The data line 640 is formed in a tier above a tier with the data line 630. The data line 650 is formed in a tier above a tier with the data line 640. The data line 660 is formed in a tier above a tier with the data line 650. The data lines 630, 640, 650 and 660 may comprise a metal such as aluminum or copper.

The data lines 630, 640, 650 and 660 are coupled to the vertical strings 602, 604, 606, 608 and 610 through contacts (e.g., metal plugs) and contact pads. For example, a plug 710 can be formed on the drain cap 230 of the vertical string 602 and a contact pad 716 formed around the plug 710 and in contact with the data line 630 to couple the data line 630 to the vertical string 602. A plug 720 can be formed on the drain cap 230 of the vertical string 604 and a contact pad 726 formed around the plug 720 and in contact with the data line 640 to couple the data line 640 to the vertical string 604. A plug 730 can be formed on the drain cap 230 of the vertical string 606 and a contact pad 736 formed around the plug 730 and in contact with the data line 650 to couple the data line 650 to the vertical string 606. A plug 740 can be formed on the drain cap 230 of the vertical string 608 and a contact pad 746 formed around the plug 740 and in contact with the data line 660 to couple the data line 660 to the vertical string 608. A plug 750 can be formed on the drain cap 230 of the vertical string 610 and a contact pad 756 formed around the plug 750 and in contact with the data line 630 to couple the data line 630 to the vertical string 610. The data lines 640, 650 and 660 are coupled to only one vertical string each, and the data line 630 is coupled to two vertical strings. The plugs 710, 720, 730, 740 and 750 may comprise a metal such as tungsten. The contact pads 716, 726, 736, 746 and 756 may be formed with the data lines 630, 640, 650 and 660 and may be formed of the same material (e.g., metal) as the data lines 630, 640, 650 and 660.

Figure 8:
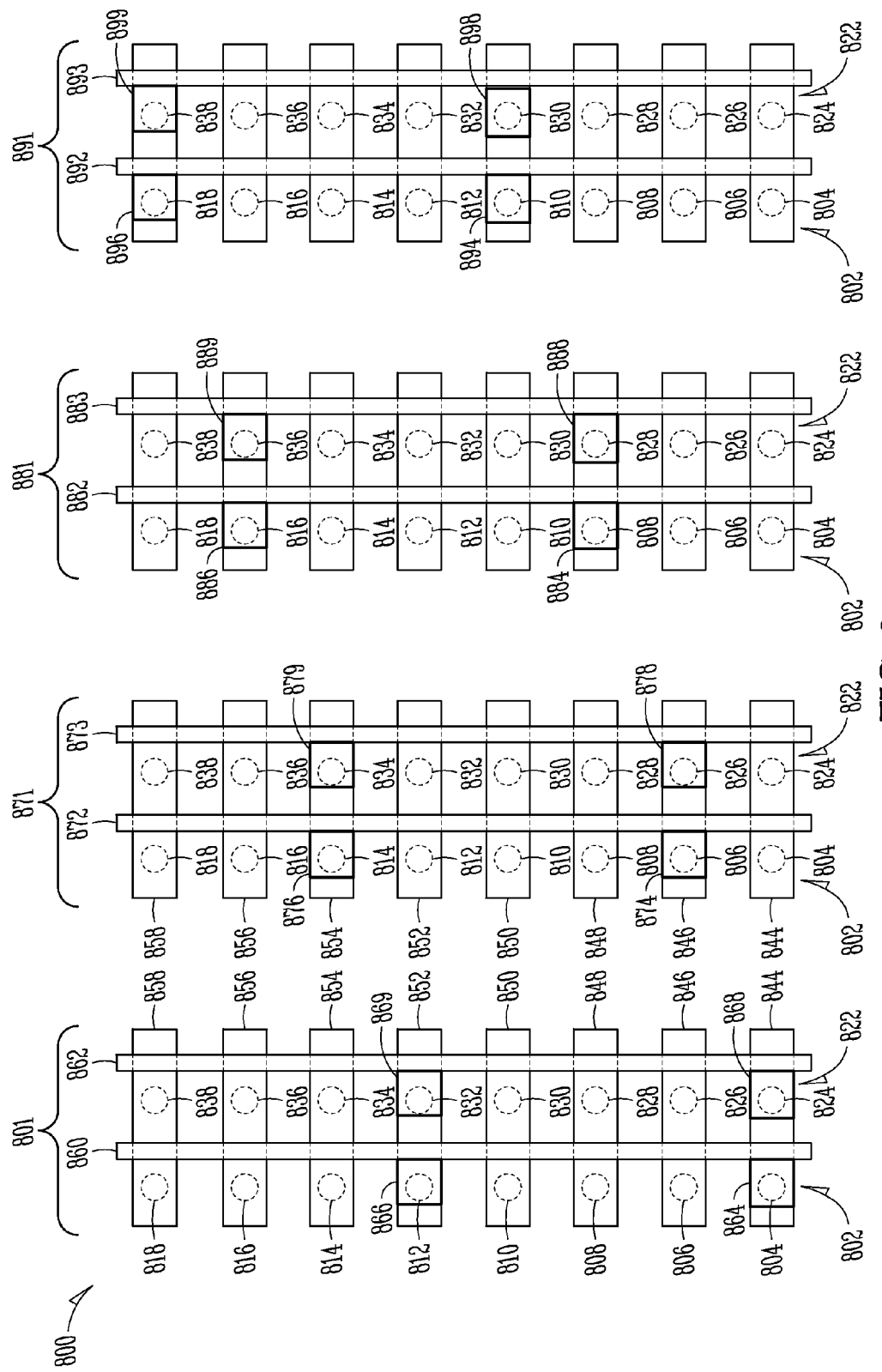
FIG. 8 is a top view of an apparatus in the form of four tiers of a semiconductor construction of two rows of vertical strings of charge storage devices according to various embodiments of the invention.

FIG. 8 is a top view of an apparatus in the form of four tiers of a semiconductor construction 800 of two rows of vertical strings of charge storage devices according to various embodiments of the invention. A first tier 801 of the semiconductor construction 800 is shown on the left-hand side of FIG. 8. The semiconductor construction 800 includes a first row 802 of vertical strings 804, 806, 808, 810, 812, 814, 816 and 818 of charge storage devices. The semiconductor construction 800 also includes a second row 822 of vertical strings 824, 826, 828, 830, 832, 834, 836 and 838 of charge storage devices. The vertical strings 804-818 and 824-838 of charge storage devices are shown as round pillars of semiconductor material similar to the pillar 210 shown in FIG. 2. The first and second rows 802 and 822 can include fewer or more vertical strings of charge storage devices according to various embodiments of the invention.

The semiconductor construction includes SGDs (e.g., control gates of SGD transistors) 844, 846, 848, 850, 852, 854, 856 and 858. Each SGD 844-858 is associated with one of the vertical strings 804-818 in the first row 802 and one of the vertical strings 824-838 in the second row 822 that is adjacent to the respective one of the vertical strings 804-818 in the first row 802. For example, the SGD 844 is associated with the vertical string 804 and the vertical string 824. The SGD 854 is associated with the vertical string 814 and the vertical string 834.

Two data lines 860 and 862 are located in the first tier 801 of the semiconductor construction 800. The data line 860 is coupled to the vertical string 804 through a contact pad 864 and a plug (not shown). The data line 860 is also coupled to the vertical string 812 through a contact pad 866 and a plug (not shown). The data line 862 is coupled to the vertical string 824 through a contact pad 868 and a plug (not shown). The data line 862 is also coupled to the vertical string 832 through a contact pad 869 and a plug (not shown). The data lines 860 and 862 may be coupled to more vertical strings in the first row 802 and the second row 822 that are not shown in FIG. 8.

A second tier 871 of the semiconductor construction 800 is located above the first tier 801 and includes two data lines 872 and 873. The data line 872 is coupled to the vertical string 806 through a contact pad 874 and a plug (not shown). The data line 872 is also coupled to the vertical string 814 through a contact pad 876 and a plug (not shown). The data line 873 is coupled to the vertical string 826 through a contact pad 878 and a plug (not shown). The data line 873 is also coupled to the vertical string 834 through a contact pad 879 and a plug (not shown). The data lines 872 and 873 may be coupled to more vertical strings in the first row 802 and the second row 822 that are not shown in FIG. 8.

A third tier 881 of the semiconductor construction 800 is located above the second tier 871 and includes two data lines 882 and 883. The data line 882 is coupled to the vertical string 808 through a contact pad 884 and a plug (not shown). The data line 882 is also coupled to the vertical string 816 through a contact pad 886 and a plug (not shown). The data line 883 is coupled to the vertical string 828 through a contact pad 888 and a plug (not shown). The data line 883 is also coupled to the vertical string 836 through a contact pad 889 and a plug (not shown). The data lines 882 and 883 may be coupled to more vertical strings in the first row 802 and the second row 822 that are not shown in FIG. 8.

A fourth tier 891 of the semiconductor construction 800 is located above the third tier 881 and includes two data lines 892 and 893. The data line 892 is coupled to the vertical string 810 through a contact pad 894 and a plug (not shown). The data line 892 is also coupled to the vertical string 818 through a contact pad 896 and a plug (not shown). The data line 893 is coupled to the vertical string 830 through a contact pad 898 and a plug (not shown). The data line 893 is also coupled to the vertical string 838 through a contact pad 899 and a plug (not shown). The data lines 892 and 893 may be coupled to more vertical strings in the first row 802 and the second row 822 that are not shown in FIG. 8.

Figure 9:
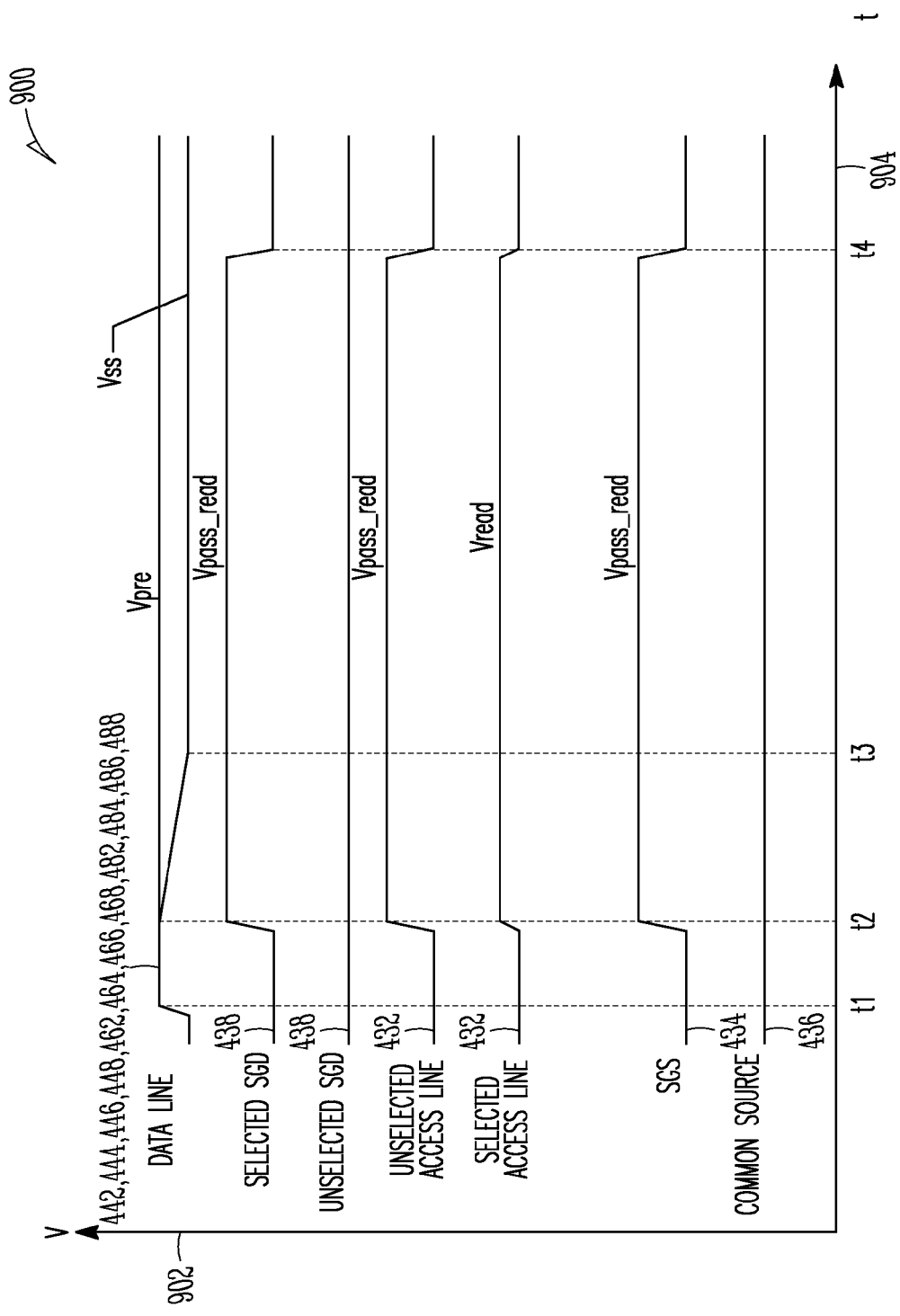
FIG. 9 is a timing diagram for a read operation on the block of FIG. 4 according to various embodiments of the invention.

Operations of the embodiments of the invention can be illustrated with reference to timing diagrams. Two or more of the charge storage devices 432 in the block 400 shown in FIG. 4 can be selected to be read or programmed or erased at the same time. FIG. 9 is a timing diagram 900 for a read operation on the block 400 of FIG. 4 according to various embodiments of the invention. The timing diagram 900 illustrates potentials of the data lines 442, 444, 446, 448, 462, 464, 466, 468, 482, 484, 486 and 488 in the block 400. The timing diagram 900 also illustrates gate potentials of selected SGD transistors 438 of vertical strings with a charge storage device 432 to be read, unselected SGD transistors 438 of vertical strings without a charge storage device 432 being read, and SGS transistors 434 in the block 400. Also shown are potentials of selected access lines coupled to selected charge storage devices 432 to be read, unselected access lines coupled to unselected charge storage devices 432 that will not be read, and a potential of the common source 436.

All of the above-listed potentials can be at a reference voltage Vss (e.g., a ground voltage) before the read operation begins. The potentials of the data lines 442, 444, 446, 448, 462, 464, 466, 468, 482, 484, 486 and 488 can be raised to Vpre at a time t1, and these potentials may stay the same or fall depending on the state of the charge storage devices 432 being read. The unselected SGD transistors 438 are switched off during the read operation by the reference voltage Vss. The common source 436 can remain at the reference voltage Vss during the read operation. The selected SGD transistors 438, the unselected charge storage devices 432 and all of the SGS transistors 434 can be switched on by a voltage Vpass_read applied to their respective control gates at a time t2, with the unselected charge storage devices 432 receiving the potential Vpass_read from the unselected access lines. The SGS transistors 434 are switched on to draw current from the vertical strings in the block 400 to the common source 436.

A selected access line can be raised to a read voltage Vread that is thus applied to the gates of the selected charge storage devices 432 at the time t2, and the states of the selected charge storage devices 432 can be read following the time t2. Those of the data lines 442, 444, 446, 448, 462, 464, 466, 468, 482, 484, 486 and 488 that are coupled to programmed charge storage devices 432 being read remain at Vpre as the programmed charge storage devices 432 remain switched off during the read operation. Those of the data lines 442, 444, 446, 448, 462, 464, 466, 468, 482, 484, 486 and 488 that are coupled to unprogrammed charge storage devices 432 being read fall to the reference voltage Vss at a time t3 as the unprogrammed charge storage devices 432 are switched on by the read voltage Vread. All of the above-listed potentials can either remain at the reference voltage Vss or fall to the reference voltage Vss at a time t4 at the end of the read operation.

The read operation is for single level (SLC) memory cells in the block 400 of FIG. 4 for purposes of brevity and clarity. The read operation illustrated in FIG. 9 and described above can be extended to a read operation for multilevel (MLC) memory cells in the block 400 of FIG. 4 by using different read voltages Vread and other modifications according to various embodiments of the invention.

Figure 10:
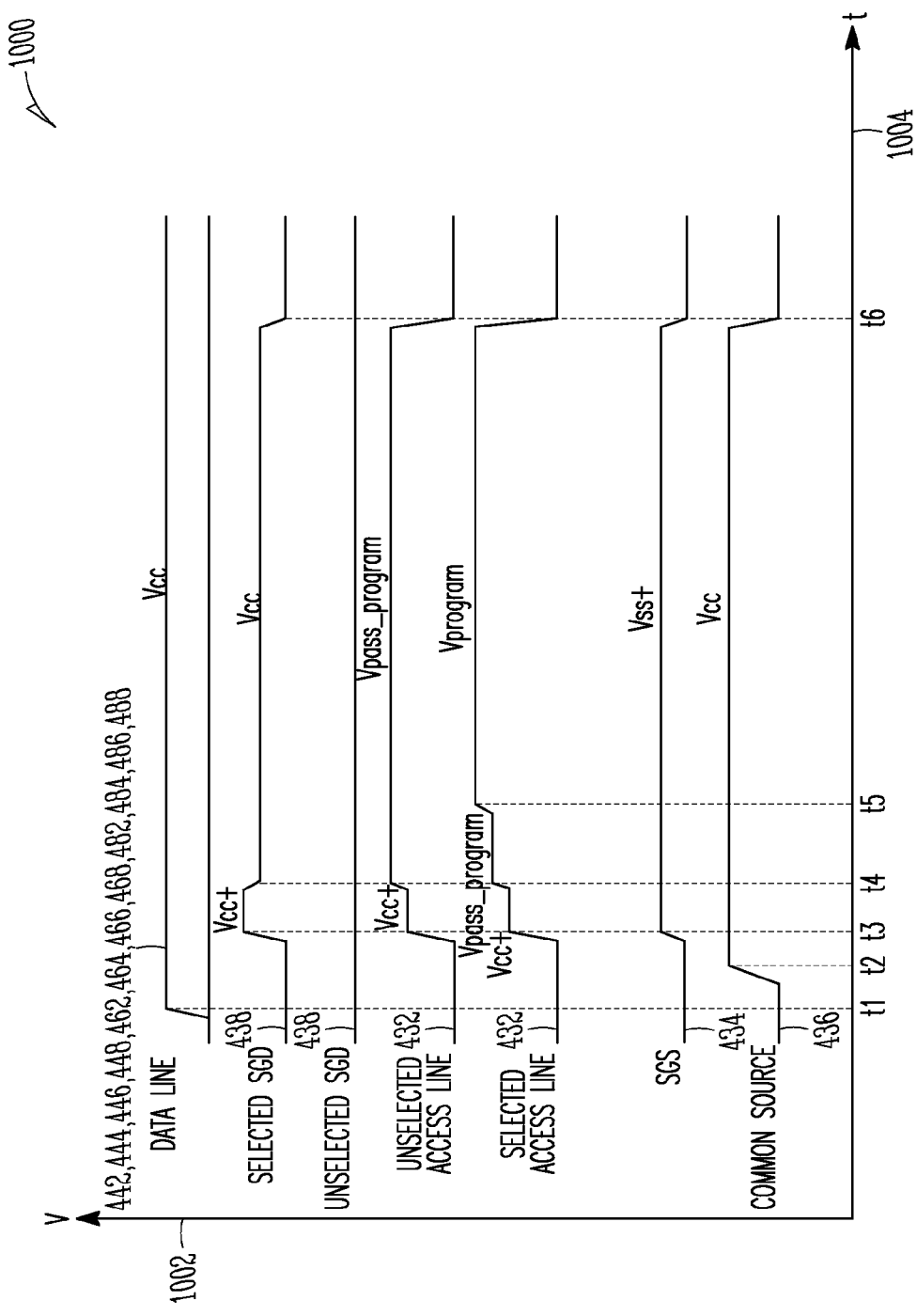
FIG. 10 is a timing diagram for a programming operation on the block of FIG. 4 according to various embodiments of the invention.

FIG. 10 is a timing diagram 1000 for a programming operation on the block 400 of FIG. 4 according to various embodiments of the invention. The timing diagram 1000 illustrates potentials of the data lines 442, 444, 446, 448, 462, 464, 466, 468, 482, 484, 486 and 488 in the block 400. The timing diagram 1000 also illustrates gate potentials of selected SGD transistors 438 of vertical strings with a charge storage device 432 to be programmed, unselected SGD transistors 438 of vertical strings without a charge storage device 432 being programmed, and SGS transistors 434 in the block 400. Also shown are potentials of selected access lines coupled to selected charge storage devices 432 to be programmed, unselected access lines coupled to unselected charge storage devices 432 that will not be programmed, and a potential of the common source 436.

All of the above-listed potentials can be at a reference voltage Vss (e.g., a ground voltage) before the programming operation begins. The potentials of some of the data lines 442, 444, 446, 448, 462, 464, 466, 468, 482, 484, 486 and 488 can be raised to a supply voltage Vcc at a time t1 to inhibit programming in the vertical strings coupled to those data lines at Vcc. Others of the data lines 442, 444, 446, 448, 462, 464, 466, 468, 482, 484, 486 and 488 that are coupled to selected vertical strings with charge storage devices 432 to be programmed can remain at the reference voltage Vss or slightly above the reference voltage Vss. The common source 436 can be raised to the supply voltage Vcc at a time t2 for the duration of the programming operation. An elevated supply voltage Vcc+ that is above the supply voltage Vcc can be applied during the programming operation. For example, the selected SGD transistors 438 can be switched on at a time t3 by the elevated supply voltage Vcc+ applied to their control gates to pre-charge the channels of the selected vertical strings. The selected SGD transistors 438 remain switched on after a time t4 with their control gates at the supply voltage Vcc. The unselected SGD transistors 438 can be switched off during the programming operation by the reference voltage Vss. All of the SGS transistors 434 can be switched off during the programming operation by a voltage Vss+ on their control gates that is slightly above the reference voltage Vss to substantially isolate the vertical strings in the block 400 from the common source 436.

The selected and unselected access lines can be used to apply the elevated supply voltage Vcc+ to the control gates of all of the charge storage devices 432 between the times t3 and t4 while the channels of the selected vertical strings are being pre-charged. The unselected access lines can then be used to apply a voltage Vpass_program to the control gates of the unselected charge storage devices 432 such that they are switched on during the programming operation after the time t4. A selected access line can be used to apply the voltage Vpass_program to the control gates of the selected charge storage devices 432 between the time t4 and a time t5. The selected access line can then be used to apply a voltage Vprogram that is above the voltage Vpass_program to the control gates of the selected charge storage devices 432 after the time t5 to program the selected charge storage devices 432. All of the above-listed potentials can fall to the reference voltage Vss at a time t6 at the end of the programming operation.

Figure 11:
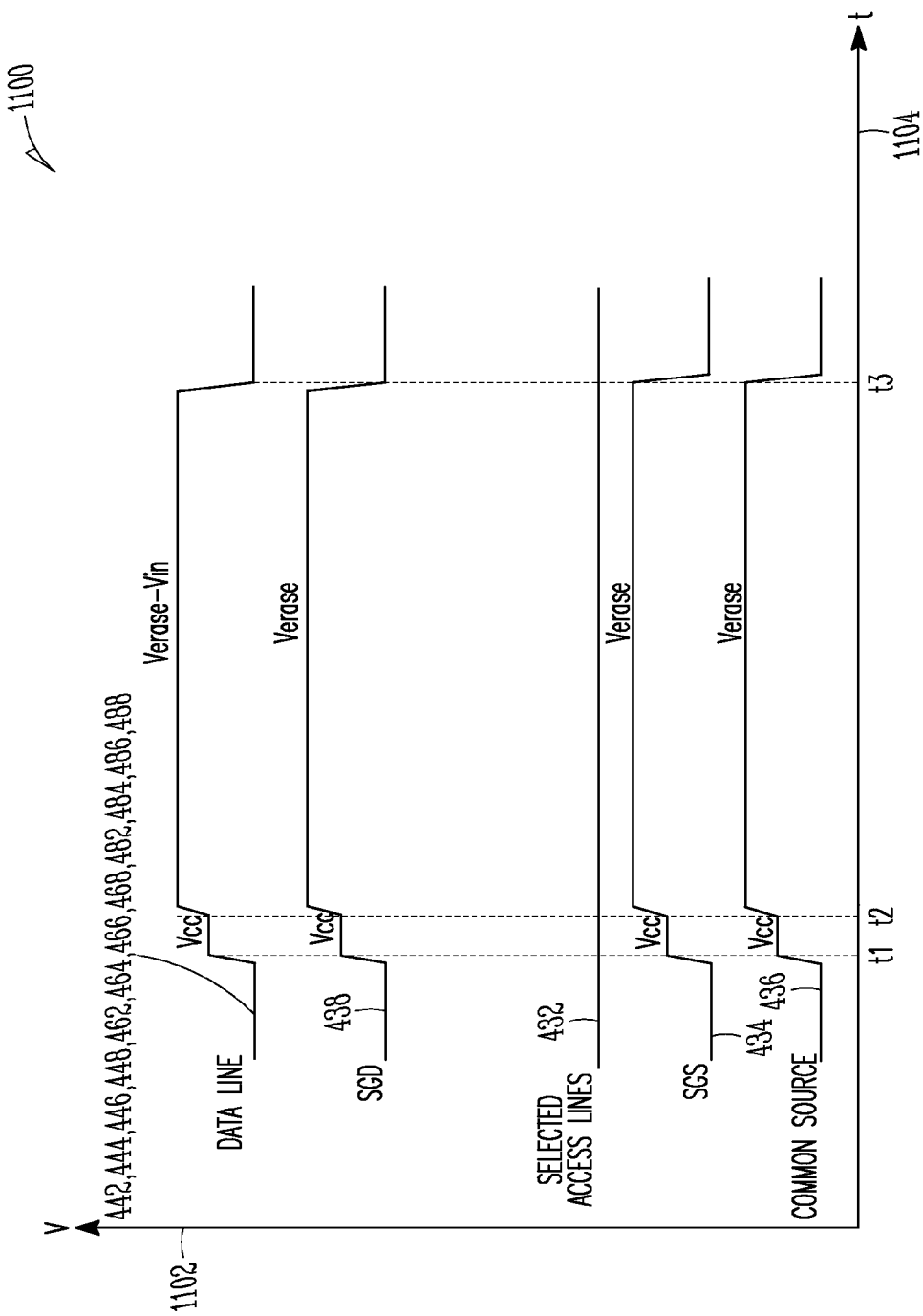
FIG. 11 is a timing diagram for an erase operation on the block of FIG. 4 according to various embodiments of the invention.

FIG. 11 is a timing diagram 1100 for an erase operation on the block 400 of FIG. 4 according to various embodiments of the invention. The timing diagram 1100 illustrates potentials of the data lines 442, 444, 446, 448, 462, 464, 466, 468, 482, 484, 486 and 488, with gate potentials of all of the SGD transistors 438 and all of the SGS transistors 434 in the block 400. Also shown are potentials of all of the access lines coupled to the charge storage devices 432 to be erased and a potential of the common source 436.

All of the above-listed potentials can be at a reference voltage Vss (e.g., a ground voltage) before the erase operation begins. The potentials of the gates of the SGD transistors 438 and the SGS transistors 434 and the common source 436 can all be raised to the supply voltage Vcc at a time t1 and then raised to an erase voltage Verase at a time t2 to erase the charge storage devices 432 in the block 400. The potentials of the data lines 442, 444, 446, 448, 462, 464, 466, 468, 482, 484, 486 and 488 can be raised to the supply voltage Vcc at the time t1 and then to a potential Verase-Vin that is less than the erase voltage Verase after the time t2 when the charge storage devices 432 in the block 400 are being erased. Vin is a voltage drop across the forward-biased p-n junction between the source cap 220 or the drain cap 230 and the pillar 210 of the vertical string 100, shown in FIG. 1 and FIG. 2. The access lines can be used to apply the reference voltage Vss to the control gates of all of the charge storage devices 432 in the block 400 such that the charge storage devices 432 in the block 400 are erased. All of the above-listed potentials can either remain at or fall to the reference voltage Vss at a time t3 at the end of the erase operation.

Figure 12:
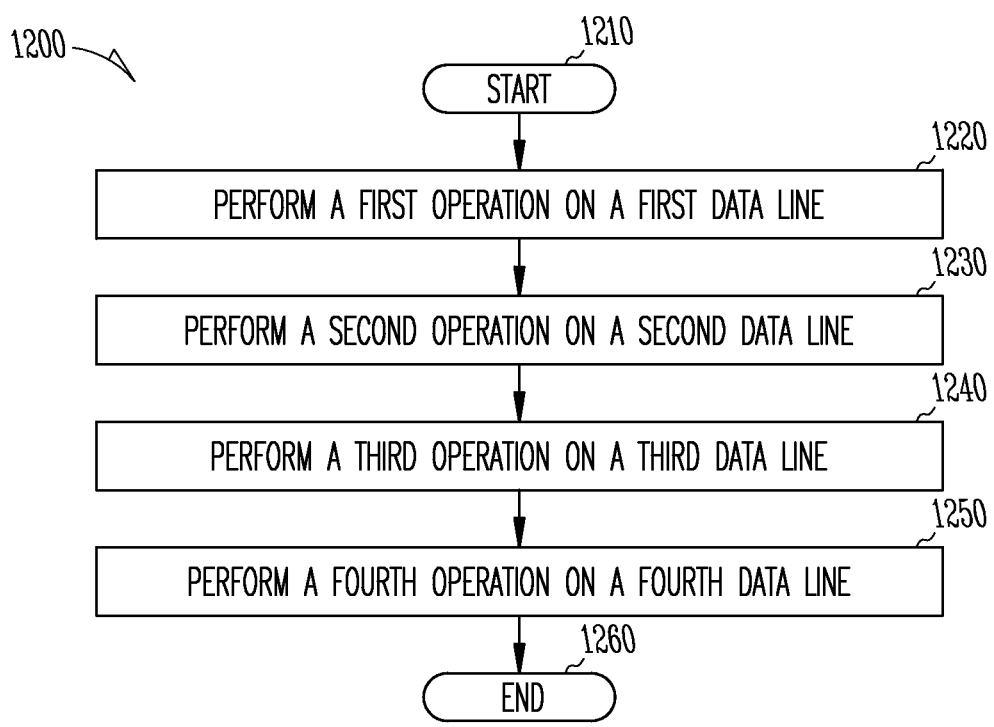
FIG. 12 is a flow diagram of a method according to various embodiments of the invention.

FIG. 12 is a flow diagram of a method 1200 according to various embodiments of the invention. In block 1210, the method 1200 starts. In block 1220, a first operation is performed with respect to a first data line coupled to a first vertical string of charge storage devices in a first row of vertical strings of charge storage devices in a block. The first operation can be sensing a data state of a charge storage device coupled the first data line or raising a potential of the first data line to inhibit programming of charge storage devices of the first vertical string in the first row. In block 1230, a second operation is performed with respect to a second data line coupled to a second vertical string of charge storage devices in the first row of vertical strings. The second operation can be sensing a data state of a charge storage device coupled to the second data line or raising a potential of the second data line to inhibit programming of charge storage devices of the second vertical string in the first row. In block 1240, a third operation is performed with respect to a third data line coupled to a first vertical string of charge storage devices in a second row of vertical strings of charge storage devices in the block. The third operation can be sensing a data state of a charge storage device coupled to the third data line or raising a potential of the third data line to inhibit programming of charge storage devices of the first vertical string in the second row. In block 1250, a fourth operation is performed with respect to a fourth data line coupled to a second vertical string of charge storage devices in the second row of vertical strings of charge storage devices. The fourth operation can be sensing a data state of a charge storage device coupled to the fourth data line or raising a potential of the fourth data line to inhibit programming of charge storage devices of the second vertical string in the second row. In block 1260, the method 1200 ends. The method 1200 may perform an operation with respect to only one of the first, second, third and fourth data lines at a time. The method 1200 may perform an operation with respect to at least two of the first, second, third and fourth data lines simultaneously. The method 1200 may perform an operation with respect to the first, second, third and fourth data lines simultaneously. Various embodiments may have more or fewer activities than those shown in FIG. 12. In some embodiments, the activities may be repeated, and/or performed in serial or parallel fashion. Some embodiments may comprise the same activities in a different order.

Four pages per block can be programmed or read by multiple data lines simultaneously according to various embodiments of the invention. In an embodiment having a page size of 16 KB, data can be accessed according to one of four options. For example, 16 KB, 32 KB, 48 KB or 64 KB of data can be accessed simultaneously. Even though one, two, three or four pages per block can be simultaneously programmed or read, lengths of the selected access lines (not shown) are not different than in conventional memory devices. The selected access lines do not draw additional power according to various embodiments of the invention. Program and read disturbance is less than in conventional memory devices.

Figure 13:
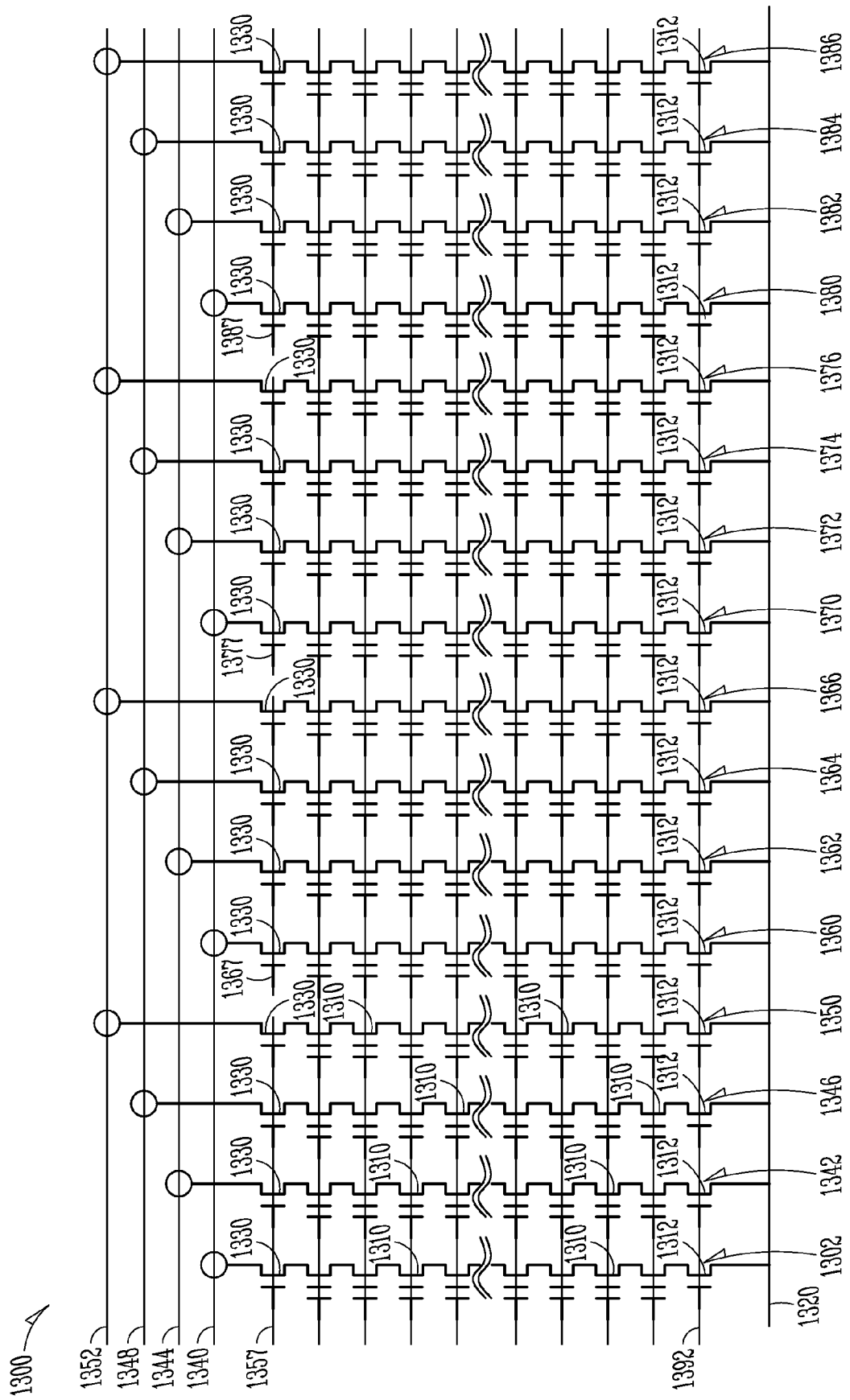
FIG. 13 is an electrical schematic diagram of an apparatus in the form of a row of vertical strings of charge storage devices according to various embodiments of the invention.

FIG. 13 is an electrical schematic diagram of an apparatus in the form of a row 1300 of vertical strings of charge storage devices according to various embodiments of the invention. The row 1300 includes multiple vertical strings of charge storage devices and is a portion of a block including multiple rows of vertical strings of charge storage devices (not shown). The row includes a vertical string 1302 including 32 charge storage devices 1310 coupled in series, and can include more or less than 32 charge storage devices 1310. Charge storage devices 1310 in the middle of the vertical string 1302 are not shown but are represented by a dashed line for purposes of brevity and clarity. The vertical string 1302 includes a SGS transistor 1312, which may be an n-channel transistor, coupled between one of the charge storage devices 1310 at one end of the vertical string 1302 and a common source 1320. The common source 1320 may comprise, for example, a slot of commonly doped semiconductor material and/or other conductive material. At the other end of the vertical string 1302, a SGD transistor 1330, which may be an n-channel transistor, is coupled between one of the charge storage devices 1310 and a first data line 1340. The common source 1320 can be coupled to a reference voltage Vss (e.g., ground voltage) or a voltage source (e.g., a charge pump circuit not shown). Thus, the vertical string 1302 may have elements similar to or identical to the elements of the vertical string 100 shown in FIG. 1.

The row 1300 includes a vertical string 1342 of charge storage devices including the same elements as the vertical string 1302. The SGD transistor 1330 of the vertical string 1342 is coupled to a second data line 1344 that is separate from the first data line 1340 and may be located above the first data line 1340 in a semiconductor construction. The SGS transistor 1312 of the vertical string 1342 is coupled to the common source 1320. The row 1300 includes a vertical string 1346 of charge storage devices including the same elements as the vertical string 1302. The SGD transistor 1330 of the vertical string 1346 is coupled to a third data line 1348 that is separate from the first data line 1340 and the second data line 1344. The third data line 1348 may be located above the second data line 1344 in a semiconductor construction. The SGS transistor 1312 of the vertical string 1346 is coupled to the common source 1320. The row 1300 includes a vertical string 1350 of charge storage devices including the same elements as the vertical string 1302. The SGD transistor 1330 of the vertical string 1350 is coupled to a fourth data line 1352 that is separate from the other data lines 1340, 1344 and 1348. The fourth data line 1352 may be located above the third data line 1348 in a semiconductor construction. The SGS transistor 1312 of the vertical string 1350 is coupled to the common source 1320. The row 1300 includes four vertical strings 1302, 1342, 1346 and 1350 that are each coupled, respectively, to a separate data line 1340, 1344, 1348 and 1352. Control gates of a first group of the SGD transistors 1330 of the vertical strings 1302, 1342, 1346 and 1350 are connected to a line 1357 to receive a first signal.

The row 1300 includes additional vertical strings of charge storage devices coupled to each of the data lines 1340, 1344, 1348 and 1352. A vertical string 1360 of charge storage devices is coupled to the data line 1340, a vertical string 1362 of charge storage devices is coupled to the data line 1344, a vertical string 1364 of charge storage devices is coupled to the data line 1348 and a vertical string 1366 of charge storage devices is coupled to the data line 1352. Each of the vertical strings 1360, 1362, 1364 and 1366 includes the same elements as the vertical string 1302. Control gates of a second group of the SGD transistors 1330 of the vertical strings 1360, 1362, 1364 and 1366 are connected to a line 1367 to receive a second signal separate from the first signal.

A vertical string 1370 of charge storage devices is coupled to the data line 1340, a vertical string 1372 of charge storage devices is coupled to the data line 1344, a vertical string 1374 of charge storage devices is coupled to the data line 1348 and a vertical string 1376 of charge storage devices is coupled to the data line 1352. Each of the vertical strings 1370, 1372, 1374 and 1376 includes the same elements as the vertical string 1302. Control gates of a third group of the SGD transistors 1330 of the vertical strings 1370, 1372, 1374 and 1376 are connected to a line 1377 to receive a third signal separate from the first signal and the second signal.

A vertical string 1380 of charge storage devices is coupled to the data line 1340, a vertical string 1382 of charge storage devices is coupled to the data line 1344, a vertical string 1384 of charge storage devices is coupled to the data line 1348 and a vertical string 1386 of charge storage devices is coupled to the data line 1352. Each of the vertical strings 1380, 1382, 1384 and 1386 includes the same elements as the vertical string 1302. Control gates of a fourth group of the SGD transistors 1330 of the vertical strings 1380, 1382, 1384 and 1386 are connected to a line 1387 to receive a fourth signal separate from the first signal, the second signal and the third signal.

All of the vertical strings 1302 and 1342-1386 in the row 1300 are coupled to the common source 1320. The charge storage devices 1310 in the same position in each of the vertical strings 1302 and 1342-1386 have their control gates coupled to the same access line (not shown) to receive the same signal. The SGS transistors 1312 of all of the vertical strings 1302 and 1342-1386 have control gates coupled to the same select line 1392 to receive the same signal.

As shown in FIG. 13, control gates of the SGD transistors 1330 are coupled together in each of four groups of the vertical strings: the first group including the vertical strings 1302, 1342, 1346 and 1350; the second group including the vertical strings 1360, 1362, 1364 and 1366; the third group including the vertical strings 1370, 1372, 1374 and 1376 and the fourth group including the vertical strings 1380, 1382, 1384 and 1386. One of the four groups can be selected at one time and four pages of data per block may be programmed or read at the same time in the row 1300. The longer page size is realized without increasing power consumption during programming or read operations. In addition, spacing between the vertical strings 1302 and 1342-1386 in a semiconductor construction can be reduced.

Figure 14:
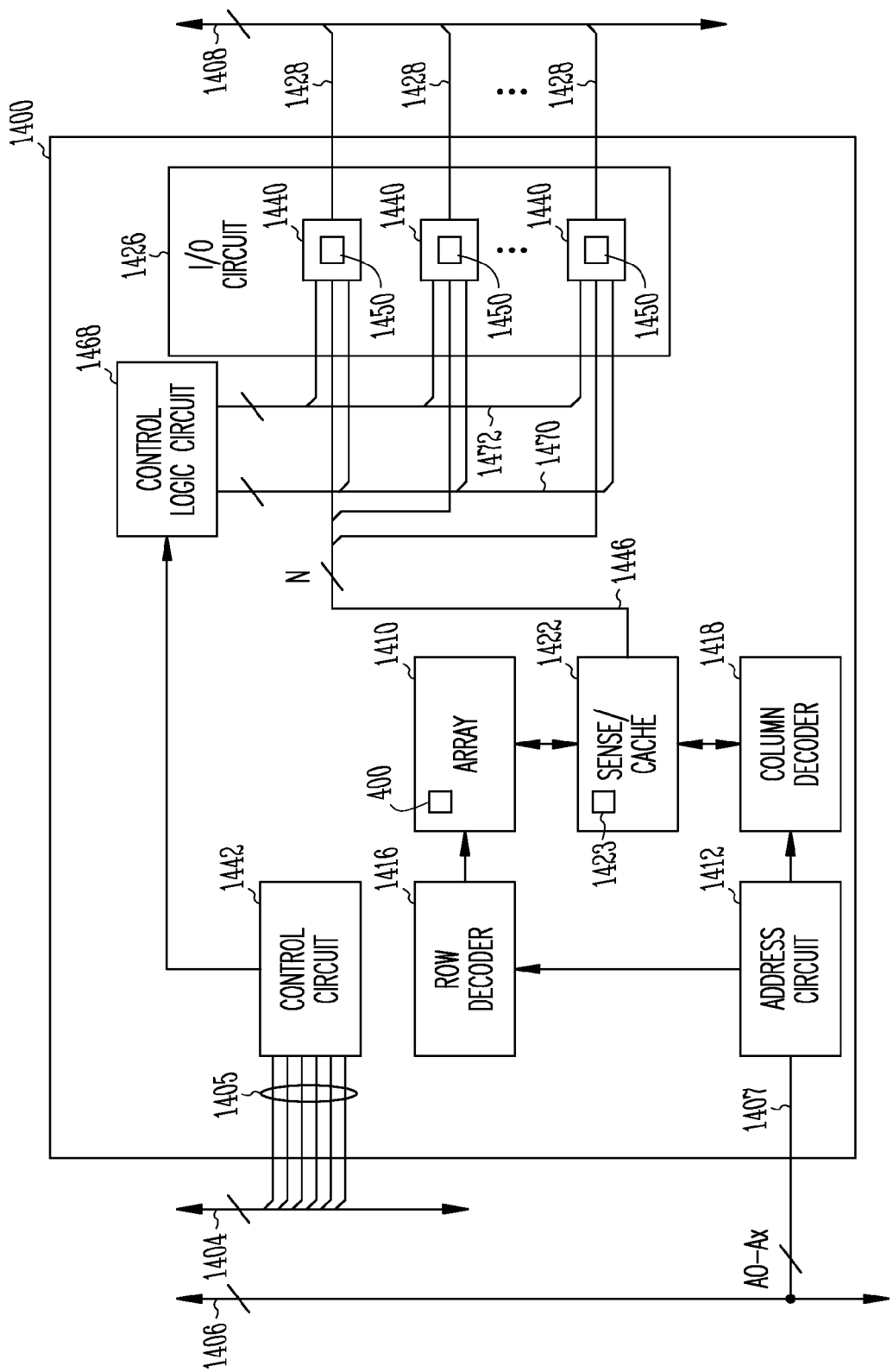
FIG. 14 is a block diagram of an apparatus in the form of a memory device according to various embodiments of the invention.

FIG. 14 is a block diagram of an apparatus in the form of a memory device 1400 according to various embodiments of the invention. The memory device 1400 is coupled to a control bus 1404 to receive multiple control signals over control signal lines 1405. The memory device 1400 is also coupled to an address bus 1406 to receive address signals A0-Ax on address signal lines 1407 and to a data bus 1408 to transmit and receive data signals. Although depicted as being received on separate physical busses, the data signals could also be multiplexed and received on the same physical bus. The memory device 1400 may be coupled to a processor (not shown) in a system.

The memory device 1400 includes one or more arrays 1410 of memory cells that can be arranged in rows and in columns. The memory cells of the array 1410 can be non-volatile memory cells (e.g., charge storage devices, such as floating gate transistors or charge trap transistors) according to various embodiments of the invention. The memory device 1400 can be a NAND memory device. The array 1410 can include multiple banks and blocks of memory cells residing on a single die or on multiple dice as part of the memory device 1400. The memory cells in the array 1410 can be SLC or MLC memory cells, or combinations thereof. The array 1410 includes one or more of the block 400 of charge storage devices 432 shown in FIG. 4 according to various embodiments of the invention.

An address circuit 1412 can latch the address signals A0-Ax received on the address signal lines 1407. The address signals A0-Ax can be decoded by a row decoder 1416 and a column decoder 1418 to access data stored in the array 1410. The memory device 1400 can read data in the array 1410 by sensing voltage or current changes in memory cells in the array 1410 using sense devices in a sense/cache circuit 1422. The sense/cache circuit 1422 includes a sense and latch circuit 1423 coupled to each of the data lines in the block 400 to sense and latch a data state of the respective data lines 442, 444, 446, 448, 462, 464, 466, 468, 482, 484, 486 and 488 shown in FIG. 4.

A data input and output (I/O) circuit 1426 implements bi-directional data communication over external (e.g., data I/O) nodes 1428 coupled to the data bus 1408. The I/O circuit 1426 includes N driver and receiver circuits 1440 according to various embodiments of the invention. The memory device 1400 includes a controller that is configured to support operations of the memory device 1400, such as writing data to and/or erasing data from the array 1410. The controller can comprise, for example, control circuitry 1442 (e.g., configured to implement a state machine) on a same or different die than that which includes the array 1410 and/or any or all of the other components of the memory device 1400. The controller can comprise the control circuitry 1442, firmware, software or combinations of any or all of the foregoing. Data can be transferred between the sense/cache circuit 1422 and the I/O circuit 1426 over N signal lines 1446. Embodiments of the invention shown in FIGS. 9-12, among others, can be implemented using the controller.

Each driver and receiver circuit 1440 includes a driver circuit 1450. Control signals can be provided to the driver circuits 1450 (e.g., through control logic circuit 1468 that is coupled to the control circuitry 1442). The control logic circuit 1468 can provide the control signals over lines 1470 and 1472 to the driver circuits 1450.

The embodiments described herein can increase the accessible page size in a block of vertical strings of charge storage devices, as compared to the construction used in conventional memory devices. Each data line coupled to a block of charge storage devices may enable reading or programming a relatively large amount of data in the block at one time. Additional data lines coupled to the block can enable reading or programming additional data simultaneously without increased power consumption due to the activity of access lines for the block, since the access lines are pre-charged for a read or a programming event without reference to the amount of data being read or programmed. The additional data lines are pre-charged for a read operation, but the capacitance of the data lines is less than the capacitance of the access lines, and the additional power required by the multiple data lines is justified by the increased page size. This can lead to a significant performance improvement for devices that implement the mechanisms described herein.

Example structures and methods of blocks of vertical strings of charge storage devices have been described as specific embodiments, but it will be evident that various modifications and changes may be made. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
a plurality of rows of vertical strings of memory cells, each vertical string comprising a respective plurality of memory cells; and
a respective plurality of data lines associated with each row of vertical strings, each data line associated with a respective row being coupled to at least one of the vertical strings in the respective row, wherein the plurality of rows of vertical strings of memory cells comprise a first row of vertical strings and a second row of vertical strings, wherein the first row of vertical strings comprises:
a first vertical string coupled to a first data line located in a first tier;
a second vertical string adjacent to the first vertical string and coupled to a second data line, the second data line being located in a second tier above the first data line;
a third vertical string adjacent to the second vertical string and coupled to a third data line, the third data line being located in a third tier above the second data line; and
a fourth vertical string adjacent to the third vertical string and coupled to a fourth data line, the fourth data line being located in a fourth tier above the third data line;
and the second row of vertical strings comprises:
a fifth vertical string adjacent to the first vertical string and coupled to a fifth data line;
a sixth vertical string adjacent to the fifth vertical string and coupled to a sixth data line;
a seventh vertical string adjacent to the sixth vertical string and coupled to a seventh data line; and
an eighth vertical string adjacent to the seventh vertical string and coupled to an eighth data line;
wherein the fifth data line is located in the first tier, the sixth data line is located in the second tier, the seventh data line is located in the third tier, and the eighth data line is located in the fourth tier.

2. The apparatus of claim 1, wherein at least some of the memory cells comprise charge trap transistors.

3. The apparatus of claim 1, wherein at least some of the memory cells comprise floating gate transistors.

4. The apparatus of claim 1, wherein the memory cells of each vertical string are associated with a respective pillar comprising semiconductor material, and each vertical string further comprises a respective source select gate transistor and a respective drain select gate transistor.

5. The apparatus of claim 1, wherein the rows of vertical strings comprise a portion of a block of memory cells.

6. The apparatus of claim 1, further comprising a common source coupled to all of the vertical strings.

7. The apparatus of claim 1, wherein each row of vertical strings is associated with at least four respective data lines, wherein each of the at least four respective data lines is located in a different tier of a semiconductor construction.

8. The apparatus of claim 1, wherein the sixth vertical string is adjacent to the second vertical string, the seventh vertical string is adjacent to the third vertical string, and the eighth vertical string is adjacent to the fourth vertical string.

9. The apparatus of claim 8, wherein the plurality of rows of vertical strings of memory cells comprises a third row of vertical strings comprising:
a ninth vertical string adjacent to the fifth vertical string and coupled to a ninth data line;
a tenth vertical string adjacent to the ninth vertical string and the sixth vertical string, the tenth vertical string being coupled to a tenth data line;
an eleventh vertical string adjacent to the tenth vertical string and the seventh vertical string, the eleventh vertical string being coupled to an eleventh data line; and
a twelfth vertical string adjacent to the eleventh vertical string and the eighth vertical string, the twelfth vertical string being coupled to a twelfth data line, wherein the ninth data line is located in the first tier, the tenth data line is located in the second tier, the eleventh data line is located in the third tier, and the twelfth data line is located in the fourth tier.

10. The apparatus of claim 9, wherein the first row of vertical strings further comprises:
a thirteenth vertical string adjacent to the fourth vertical string and coupled to the first data line;
a fourteenth vertical string adjacent to the thirteenth vertical string and coupled to the second data line;
a fifteenth vertical string adjacent to the fourteenth vertical string and coupled to the third data line; and
a sixteenth vertical string adjacent to the fifteenth vertical string and coupled to the fourth data line.

11. The apparatus of claim 9, wherein:
the first vertical string, the fifth vertical string and the ninth vertical string are associated with a first drain select gate;
the second vertical string, the sixth vertical string and the tenth vertical string are associated with a second drain select gate;
the third vertical string, the seventh vertical string and the eleventh vertical string are associated with a third drain select gate; and
the fourth vertical string, the eighth vertical string and the twelfth vertical string are associated with a fourth drain select gate.

12. The apparatus of claim 9, further comprising a common source coupled to all of the vertical strings of the plurality of rows.

13. The apparatus of claim 1, wherein the apparatus is configured to perform an operation with respect to only one of the first, second, third and fourth data lines at a time.

14. The apparatus of claim 1, wherein the apparatus is configured to perform an operation with respect to at least two of the first, second, third and fourth data lines simultaneously.

15. The apparatus of claim 14, wherein the apparatus is configured to perform an operation with respect to the first, second, third and fourth data lines simultaneously.

16. The apparatus of claim 1, wherein the apparatus is configured to selectively perform either an operation with respect to only one of the first, second, third and fourth data lines at a time or with respect to at least two of the first, second, third and fourth data lines simultaneously.

17. The apparatus of claim 16, wherein the operation comprises a programming operation.

18. The apparatus of claim 16, wherein the operation comprises a read operation.

19. The apparatus of claim 1, wherein each data line associated with a respective row of vertical strings is located above the respective row of vertical strings.

20. The apparatus of claim 1, wherein each data line associated with a respective row of vertical strings is located below the respective row of vertical strings.

21. An apparatus comprising:
a respective plurality of data lines associated with each row of vertical strings of charge storage devices of a plurality of rows of vertical strings of charge storage devices in a block of charge storage devices, each data line associated with a respective row of vertical strings being coupled to at least one of the vertical strings in the respective row of vertical strings; and
a common source coupled to all of the vertical strings of the block,
wherein the plurality of rows of vertical strings of charge storage devices in the block of charge storage devices comprise a first row of vertical strings and a second row of vertical strings, wherein the first row of vertical strings comprises:
a first vertical string coupled to a first data line located in a first tier;
a second vertical string adjacent to the first vertical string and coupled to a second data line, the second data line being located in a second tier above the first data line;
a third vertical string adjacent to the second vertical string and coupled to a third data line, the third data line being located in a third tier above the second data line; and
a fourth vertical string adjacent to the third vertical string and coupled to a fourth data line, the fourth data line being located in a fourth tier above the third data line;
and the second row of vertical strings comprises:
a fifth vertical string adjacent to the first vertical string and coupled to a fifth data line;
a sixth vertical string adjacent to the fifth vertical string and coupled to a sixth data line;
a seventh vertical string adjacent to the sixth vertical string and coupled to a seventh data line; and
an eighth vertical string adjacent to the seventh vertical string and coupled to an eighth data line;
wherein the fifth data line is located in the first tier, the sixth data line is located in the second tier, the seventh data line is located in the third tier, and the eighth data line is located in the fourth tier.

22. The apparatus of claim 21, wherein each vertical string further comprises:
a respective drain select gate transistor coupled between a respective plurality of charge storage devices of the block of charge storage devices and a respective one of the data lines, to couple each vertical string to the respective data line and to select each vertical string; and
a respective source select gate transistor coupled between the each vertical string and the common source, to substantially control conduction between the each vertical string and the common source.

23. The apparatus of claim 21, wherein at least some of the charge storage devices of the block of charge storage devices comprise multilevel charge storage devices.

24. The apparatus of claim 21, wherein the apparatus comprises a system.

25. The apparatus of claim 21, wherein the apparatus comprises a memory device.

26. The apparatus of claim 25, wherein the memory device comprises a NOT AND (NAND) memory device.

27. An apparatus comprising:
a plurality of tiers of data lines associated with a block of vertical strings of charge storage devices, the block comprising a plurality of rows of vertical strings of charge storage devices, each vertical string being coupled to a respective one of the data lines wherein adjacent vertical strings within each row of the plurality of rows and adjacent vertical strings of different rows of the plurality of rows are coupled to different data lines; and
a common source coupled to all of the vertical strings of the block;
wherein the plurality of rows of vertical strings of charge storage devices comprise a first row of vertical strings and a second row of vertical strings, wherein the first row of vertical strings comprises:
a first vertical string coupled to a first data line located in a first tier of the plurality of tiers of data lines;
a second vertical string adjacent to the first vertical string and coupled to a second data line, the second data line being located in a second tier of the plurality of tiers of data lines above the first data line;
a third vertical string adjacent to the second vertical string and coupled to a third data line, the third data line being located in a third tier of the plurality of tiers of data lines above the second data line; and
a fourth vertical string adjacent to the third vertical string and coupled to a fourth data line, the fourth data line being located in a fourth tier of the plurality of tiers of data lines above the third data line;
and the second row of vertical strings comprises:
a fifth vertical string adjacent to the first vertical string and coupled to a fifth data line;
a sixth vertical string adjacent to the fifth vertical string and coupled to a sixth data line;
a seventh vertical string adjacent to the sixth vertical string and coupled to a seventh data line; and
an eighth vertical string adjacent to the seventh vertical string and coupled to an eighth data line;
wherein the fifth data line is located in the first tier, the sixth data line is located in the second tier, the seventh data line is located in the third tier, and the eighth data line is located in the fourth tier.

28. The apparatus of claim 27, wherein each vertical string comprises:
a respective drain select gate transistor coupled between a respective plurality of the charge storage devices and the respective one of the data lines, to couple a vertical string to the respective one of the data lines and to select the vertical string; and
a respective source select gate transistor coupled between the vertical string and the common source to substantially control conduction between the vertical string and the common source.

29. The apparatus of claim 28, wherein:
the block of vertical strings is arranged in rows, each row comprising a plurality of the vertical strings; and
a control gate of the drain select gate transistor of each of the vertical strings in each row is coupled to receive a signal that is separate from signals to be received by control gates of other drain select gate transistors in the row.

30. The apparatus of claim 28, wherein:
the vertical strings are arranged in rows, each row comprising a plurality of the vertical strings; and
for each row, control gates of a first group of drain select gate transistors are coupled together to receive a first signal and control gates of a second group of drain select gate transistors are coupled together to receive a second signal separate from the first signal.

31. The apparatus of claim 30, wherein for each row:
a plurality of the drain select gate transistors are coupled to each data line associated with the row;
each vertical string of the block of vertical strings associated with the first group of drain select transistors is coupled to a different one of the data lines associated with each row; and
each vertical string of the block of vertical strings associated with the second group of drain select transistors is coupled to a different one of the data lines associated with the row.

32. The apparatus of claim 31, wherein for each row:
control gates of a third group of drain select gate transistors are coupled together to receive a third signal separate from the first signal and the second signal; and
each vertical string of the block of vertical strings associated with the third group of drain select transistors is coupled to a different one of the data lines associated with each row.

33. The apparatus of claim 27, further comprising a sense circuit coupled to each of the data lines to sense the data lines.

34. The apparatus of claim 27, wherein:
each vertical string of the block of vertical strings is arranged in rows in the block of vertical strings of charge storage devices; and
the plurality of tiers of data lines are associated with each row of vertical strings of charge storage devices, each vertical string of the block of vertical strings being coupled to a respective one of the data lines in the tiers of data lines associated with each row of vertical strings.

35. The apparatus of claim 27, wherein the each vertical string is coupled through a respective contact and a respective contact pad to the respective one of the data lines.

36. The apparatus of claim 35, wherein:
each data line comprises at least one of aluminum and copper;
each contact comprises tungsten; and
each contact pad comprises at least one of aluminum and copper.

* * * * *